(12) United States Patent
Wavering et al.

(10) Patent No.: US 7,692,924 B2
(45) Date of Patent: Apr. 6, 2010

(54) RACK FOR HOUSING A LIQUID-COOLED ELECTRIC UNIT

(75) Inventors: Jeffrey T. Wavering, Rockford, IL (US); Francis C. Belisle, Roscoe, IL (US); Darin R. Driessen, West Bend, WI (US); Tsutomu Yasui, Fuwa-gun (JP)

(73) Assignees: Nabtesco Corporation, Tokyo (JP); Hamilton Sundstrand, Rockford, IL (US)

( * ) Notice: Subject to any disclaimer, the term of this patent is extended or adjusted under 35 U.S.C. 154(b) by 38 days.

(21) Appl. No.: 12/073,250

(22) Filed: Mar. 3, 2008

(65) Prior Publication Data

US 2009/0219692 A1    Sep. 3, 2009

(51) Int. Cl.
*H05K 7/20* (2006.01)
(52) U.S. Cl. .................. 361/699; 361/689; 174/15.1; 165/80.4; 165/104.33
(58) Field of Classification Search .................. 361/689, 361/699; 174/15.1; 165/80.4, 104.33
See application file for complete search history.

(56) References Cited

U.S. PATENT DOCUMENTS

| | | | |
|---|---|---|---|
| 6,393,853 B1 * | 5/2002 | Vukovic et al. ............ 62/259.2 |
| 6,828,675 B2 * | 12/2004 | Memory et al. ............. 257/714 |
| 7,050,299 B2 * | 5/2006 | Kondo et al. ................. 361/689 |
| 7,408,775 B2 * | 8/2008 | Walz et al. ................... 361/699 |
| 7,450,385 B1 * | 11/2008 | Campbell et al. ........... 361/699 |
| 2004/0057211 A1 | 3/2004 | Kondo et al. |
| 2005/0047083 A1 | 3/2005 | Kondo et al. |

FOREIGN PATENT DOCUMENTS

| | | |
|---|---|---|
| JP | U-6-60190 | 8/1994 |
| JP | A-9-298378 | 11/1997 |
| JP | A-10-70386 | 3/1998 |
| JP | A-2002-374086 | 12/2002 |
| JP | A-2003-110273 | 4/2003 |
| JP | A-2004-246615 | 9/2004 |

* cited by examiner

*Primary Examiner*—Boris L Chervinsky
(74) *Attorney, Agent, or Firm*—Oliff & Berridge PLC

(57) ABSTRACT

The present invention provides a rack suitable for housing a liquid-cooled electric unit. A rack 2 comprises an electric connector 12 for supplying electricity to the housed electric unit 50, and a fluid connector 14 for supplying cooling liquid to the housed electric unit 50. The fluid connector 14 and the electric connector 12 are arranged at different positions in a horizontal cross section (plane) of the rack 2. More preferably, the electric connector 12 is mounted on a back panel 6 of the rack 2, while the fluid connector 14 is mounted on the foreside of the rack 2. Such a configuration makes it less likely that the cooling liquid leaking from the fluid connector 14 drips onto the electric connector 12.

6 Claims, 2 Drawing Sheets

RACK FOR HOUSING A LIQUID-COOLED ELECTRIC UNIT

BACKGROUND OF THE INVENTION

1. Field of the Invention

The present invention relates to a rack for housing a liquid-cooled electric unit and for supplying electricity and cooling liquid to the electric unit.

2. Description of the Related Art

A rack for housing electric units in which electric circuits are built is known. On the rack, electric connectors are mounted for supplying power to the housed electric unit.

BRIEF SUMMARY OF THE INVENTION

In recent years, there have appeared liquid-cooled electric units capable of effectively cooling circuits inside the electric unit. In such liquid-cooled electric units, cooling liquid must be supplied from outside the unit. Also required is the rack that can supply both electricity and cooling liquid. Therefore, the rack for housing a liquid-cooled electric unit may have an electric connector and a fluid connector. Herein, cooling liquid may leak out of the fluid connector during attachment/detachment of the electric unit to/from the rack. On the other hand, the electrodes of the electric connector may be exposed during attachment/detachment of the electric unit. The cooling liquid leaking from the fluid connector must thus be prevented from dripping onto the electric connector during attachment/detachment of the electric unit.

The present description discloses a rack suitable for housing a liquid-cooled electric unit. The rack disclosed in the present description comprises an electric connector for supplying electricity to the housed electric unit, and a fluid connector for supplying cooling liquid to the housed electric unit. The electric connector and the fluid connector are arranged at different positions in the horizontal cross section of the rack. That is, the electric connector is not positioned vertically below the fluid connector. Such an arrangement prevents that the cooling liquid leaking from the fluid connector drips onto the electric connector during attachment/detachment of the electric unit. The "fluid connector" may be sometimes referred to as a "fluid coupler".

Preferably, the horizontal distance between the foreside of the rack and the electric connector is different from the horizontal distance between the foreside of the rack and the fluid connector. More specifically, the electric connector may be mounted on a back panel of the rack, and the fluid connector may be mounted on the foreside of the rack. Upon fixing of the electric unit through insertion in the rack, a unit-side electric connector provided on the rear side of the electric unit connects with the electric connector mounted on the back panel of the rack. Simultaneously therewith, a unit-side fluid connector provided on the side face of the electric unit connects with the fluid connector mounted on the foreside of the rack. The housed electric unit is positioned between the electric connector and the fluid connector during coupling of the connectors. The electric unit prevents thus that the cooling liquid leaking from the fluid connector drips onto the electric connector.

A plate for spatially separating the electric connector from a tube that supplies cooling liquid to the fluid connector may also be provided in such a way that the cooling liquid leaking from the fluid connector is prevented from dripping onto the electric connector.

Preferably, such a plate surrounds the tube that supplies cooling liquid to the fluid connector. Specifically, the plate preferably forms a passage inside through which there runs the tube supplying cooling liquid to the fluid connector. Preferably, such a passage extends from a top panel of the rack to a bottom panel thereof. Even in case of leaking from the tube or the fluid connector, such leaking cooling liquid flows through the passage, and is drained out at the bottom of the rack without dripping onto the electric connector.

A trough may be formed on the top panel of the rack, while a drain hole may be formed on the bottom of the trough, for guiding water in the trough towards the passage. Water, dripping onto the rack from the ceiling of the room where the rack is installed, thus drains out of the bottom of the rack via the drain hole and the passage without dripping onto the housed electric unit.

A seal member may be further arranged in the periphery of an opening of the fluid connector. Upon insertion of the liquid-cooled electric unit in the rack, preferably, the seal member seals the space between the housed electric unit and the fluid connector. This prevents cooling liquid leakage after coupling of the fluid connector on the electric unit side with the fluid connector on the rack side.

The rack disclosed in the present description is suitable for use in the fuselage of an airplane.

The technology disclosed in the present description provides a rack for housing a liquid-cooled electric unit, such that the cooling liquid leaking from the fluid connector is less likely to drip onto the electric connector.

DESCRIPTION OF THE PREFERRED EMBODIMENT

Figure 1:
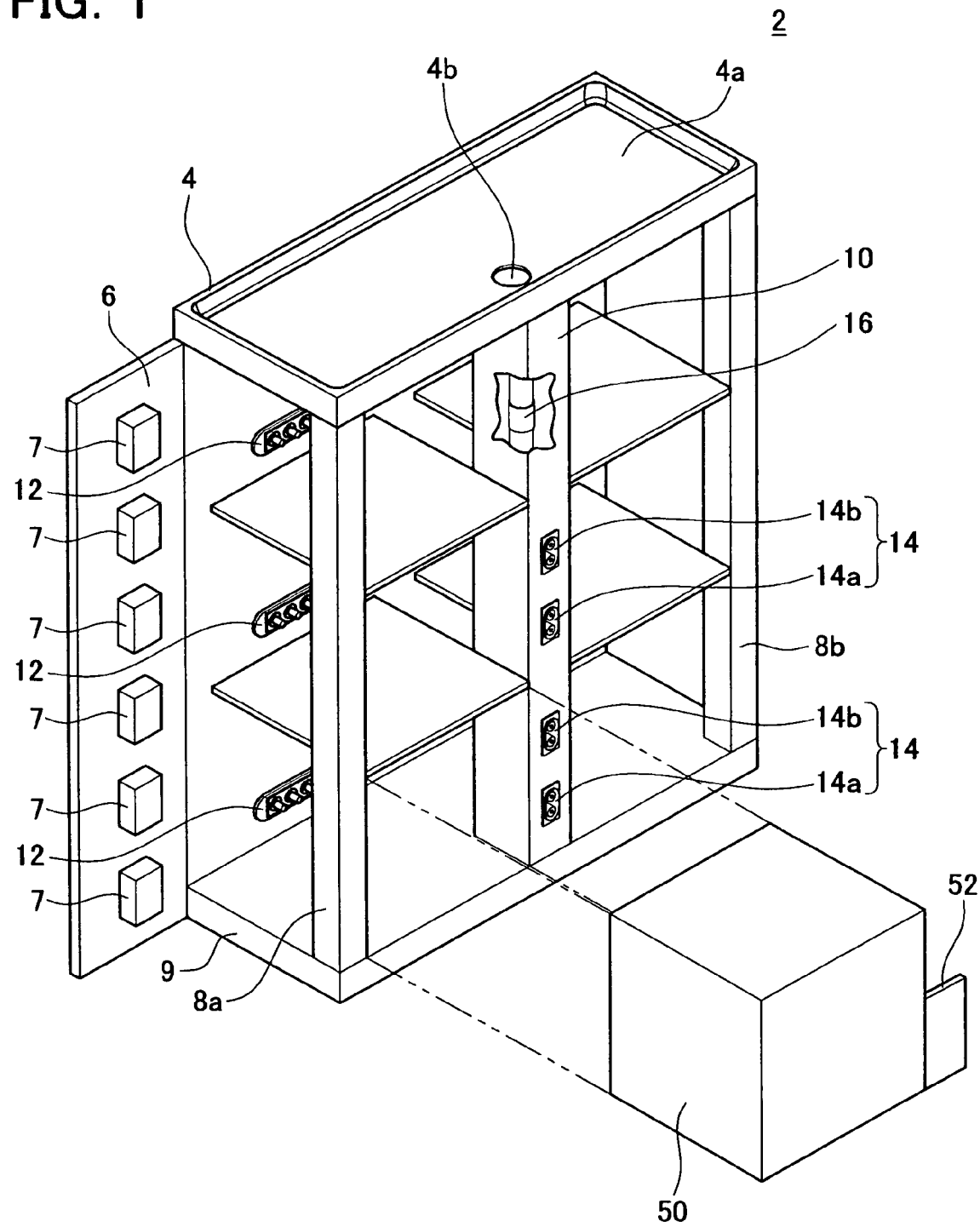
FIG. 1 is a schematic perspective-view diagram of a rack.

A preferred embodiment of the present invention is explained with reference to accompanying drawings. FIG. 1 shows a schematic perspective-view diagram of a rack 2 in the present embodiment. The rack 2 is installed in a fuselage of an airplane. For instance, the rack 2 is installed in a machine room that is adjacent to a cargo compartment in the underside of the cabin of an airplane. The rack 2 can house liquid-cooled electric units (control unit or power unit and the like) of an airplane. The rack 2 of FIG. 1 has six slots for housing electric units. An electric unit 50 in FIG. 1, for instance, is housed in the lower left slot. The rack 2 supplies electricity and cooling liquid to the housed electric unit. Therefore, the rack 2 has electric connectors for electricity and fluid connectors for cooling liquid. Each of electric connector of the rack and each of electric connector of the electric unit connect each other upon insertion of the electric unit. At the same time, each fluid connector of the rack and each fluid connector of the electric unit connect each other as well.

The rack 2 comprises a top panel 4, a back panel 6, a bottom panel 9, side struts 8a, 8b, and a central strut 10. The side struts 8a, 8b are arranged at the foreside and both sides of the rack 2. The central strut 10 is arranged at the center of the foreside of the rack 2.

Electric connectors 12 are mounted on the back panel 6. The electric connectors 12 face toward the front of the rack 2. The electric connectors 12 are provided in respective slots. FIG. 1 depicts only the electric connectors in the left slots of the rack 2, omitting the electric connectors of the right slots of the rack 2.

Figure 2:
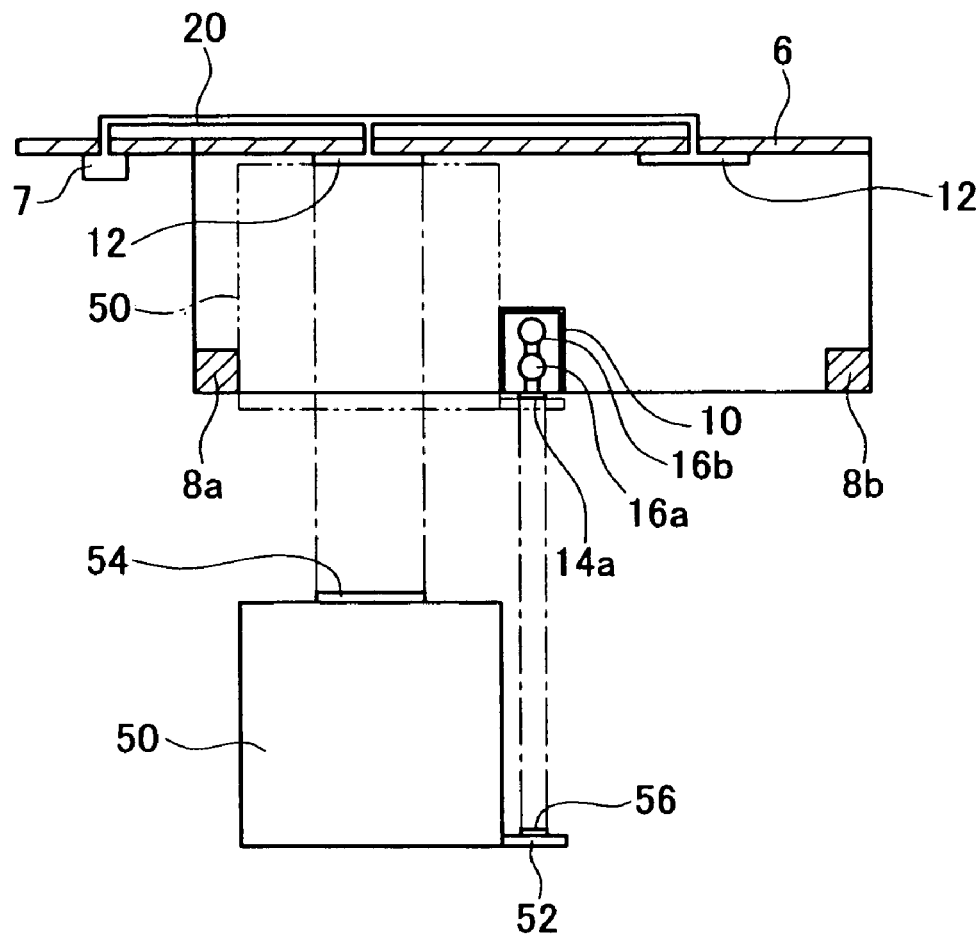
FIG. 2 is a horizontal cross-sectional diagram of the rack.

The back panel 6 juts out from the left of the rack 2, with terminal blocks 7 being mounted on the jutting portions. The terminal blocks 7 relay the power inputted/outputted in/from the rack 2. On the rear side of the back panel 6 there is arranged a busbar for transmitting electric power from the terminal blocks 7 to the electric connectors 12 (the busbar is depicted in FIG. 2).

The fluid connectors 14 are mounted on the foreside of the central strut 10. The fluid connectors 14 face also towards the front of the rack 2. On the central strut 10 there are arranged six fluid connectors 14. The upper two fluid connectors have been omitted in FIG. 1. Two fluid connectors 14 are mounted at each level of the rack 2, such that cooling liquid is supplied from the respective fluid connectors to the right and left electric units. For instance, the fluid connector 14a supplies cooling liquid to the electric unit housed in the middle left slot, while the fluid connector 14b supplies cooling liquid to the electric unit housed in the middle right slot. Upon fixing of the electric unit 50 by being inserted through the foreside of the rack 2, the electric connector 12 connects to a unit-side electric connector (not shown) arranged on the rear side of the electric unit 50. Simultaneously therewith, the fluid connector 14 connects to a unit-side fluid connector (not shown) arranged on a flange 52 of the electric unit 50.

The central strut 10 extends vertically from the top panel 4 to the bottom panel 9. Inside the central strut 10, which is hollow, a tube 16 is arranged for supplying cooling liquid to the fluid connectors 14. That is, the central strut 10 doubles as a vertical passage for the tube 16. Cooling liquid is supplied from the outside into the fluid connector 14 via the tube 16.

A trough (water collecting trough) 4a is formed on the top panel 4. The trough 4a catches water falling onto the rack 2 from above. On the bottom of the trough 4a there is provided a drain hole 4b that communicates with the interior of the central strut 10. Water caught in the trough 4a is guided into the central strut 10 via the drain hole 4b. This water is discharged out of the rack 2 through the bottom of the central strut 10.

FIG. 2 illustrates a horizontal cross-sectional view of the rack 2. The two-dotted line of FIG. 2 illustrates the electric unit 50 housed in the rack 2. The electric connectors 12 are mounted on the foreside of the back panel 6. On the rear side of the back panel 6 there is arranged a busbar 20 for transmitting electric power from the terminal block 7 to the electric connectors 12. The fluid connectors 14 are mounted on the foreside of the central strut 10. That is, the fluid connectors 14 are mounted on the foreside of the rack 2. As FIG. 2 shows, the electric connectors 12 and the fluid connectors 14 are arranged at different positions in the horizontal cross section of the rack 2. The horizontal distance from the foreside of the rack 2 to the electric connectors 12 is different from the horizontal distance from the foreside of the rack 2 to the fluid connectors 14.

The tube 16 runs through the central strut 10. The outer panels of the central strut 10 separate thus spatially the tube 16, which supplies cooling liquid to the fluid connectors 14, from the electric connectors 12. The tube 16 and the fluid connectors 14 are connected by branch piping. The cooling liquid reaches the fluid connectors 14 via the tube 16. As illustrated in FIG. 2, two tubes 16 (16a and 16b) run through the central strut 10. A first tube 16a is a tube for supplying cooling liquid to the electric units. A second tube 16b is a tube for discharging cooling liquid out of the electric units.

A unit-side electric connector 54 is arranged on the rear side of the electric unit 50. A flange 52 juts out of the right of the electric unit 50. A unit-side fluid connector 56 is mounted on the rear side of the flange 52. In other words, the unit-side fluid connector 56 is arranged on the side of the electric unit 50. The electric connector 12 connects with the unit-side electric connector 54 upon insertion of the electric unit 50 into the slot between the left strut 8a and the central strut 10. Simultaneously therewith, the fluid connector 14 connects with the unit-side fluid connector 56.

Figure 3:
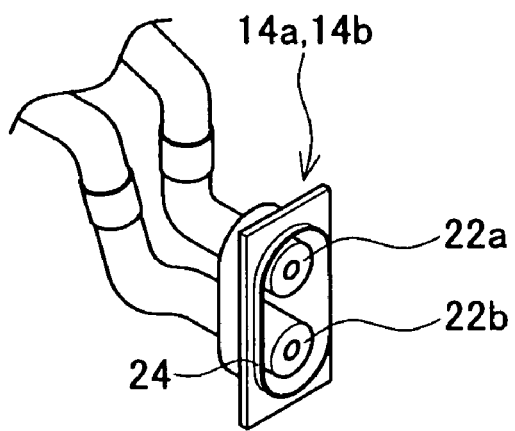
FIG. 3 is an enlarged-view diagram of a fluid connector.

FIG. 3 is an enlarged-view diagram of the fluid connector 14. One fluid connector 14a has two openings 22a, 22b. Cooling liquid is supplied to the electric unit via the first opening 22a. The cooling liquid that has cooled the electric unit is recovered via the second opening 22b. The fluid connector 14a has a seal member 24. The seal member 24 surrounds the two openings 22a, 22b. The seal member 24 sticks to the rear side of the flange 52 upon coupling of the fluid connector 14a with the unit-side fluid connector 56 (see FIG. 2). That is, the space surrounding the openings 22a, 22b is sealed by the seal member 24 sticks to the unit upon insertion of the electric unit in the rack 2.

The technical features and advantages of the above rack 2 are listed below.

(1) The rack 2 comprises the electric connectors 12 for supplying electric power to the housed liquid-cooled electric unit 50, and the fluid connectors 14 for supplying cooling liquid to the electric unit 50.

(2) The fluid connectors 14 and the electric connectors 12 are arranged at different positions in the horizontal cross section of the rack 2. Therefore, even in case of cooling liquid leaking out of the fluid connectors 14, thus the leaked cooling liquid is less likely to drip onto the electric connectors 12.

(3) The electric connectors 12 are mounted on the back panel 6, while the fluid connectors 14 are mounted on the foreside of the rack 2. The electric connector 12 connects with the unit-side electric connector 54 upon insertion of the electric unit 50 into the rack 2. Simultaneously therewith, the fluid connector 14 connects with the unit-side fluid connector 56. Herein, the chassis of the electric unit 50 is positioned between the electric connector 12 and the fluid connector 14. Even in case of leaking cooling liquid from the fluid connector 14, the chassis of the electric unit 50 prevents thus the leaked cooling liquid from reaching the electric connector 12.

(4) The rack 2 comprises the central strut 10 (tube passage) extending vertically from the top panel 4. The tube 16, for supplying cooling liquid to the fluid connectors 14, runs through the central strut 10. The outer panels of the central strut 10 separate spatially the electric connectors 12 from the tube 16. Furthermore, the outer panels of the central strut 10 surround the tube 16. The central strut 10 (passage) prevents that cooling liquid leaking from the tube 16 drip onto the electric connector 12.

(5) The trough 4a is formed on the top panel 4 of the rack 2. On the bottom of the trough 4a there is formed the drain hole 4b for guiding water into the central strut 10. Water falling onto the rack 2 from above is caught in the trough 4a. The water caught in the trough 4a passes through the drain hole 4b and the central strut 10, and is drained under the rack 2. The trough 4a and the drain hole 4b prevent water falling onto the rack 2 from dripping onto the electric units housed in the rack 2.

(6) The seal member 24 is attached around the openings 22a, 22b of the fluid connectors 14. The space surrounding the openings 22a, 22b is sealed by the seal member 24 that sticks to the electric unit upon coupling of the fluid connectors 14 with the unit-side fluid connectors. The seal member 24 prevents thus splashing of cooling liquid leaking from the openings 22a, 22b.

(7) The central strut 10 is arranged at the center of the foreside of the rack 2. Slots for housing the electric units are provided at the both sides of the central strut 10. Cooling liquid is supplied to the electric units housed on both sides of the central strut 10 via the tube 16 that runs through the central strut 10.

(8) The rack 2 is suitably installed in an airplane, for housing the airplane control unit (electric unit and the like).

The detailed explanation of the present invention thus far is merely illustrative in nature, and is not meant to limit the scope of the claims in any way. The technology as recited in the claims includes various alterations and modifications to the specific examples illustrated above. For instance, the electric connectors comprised in the rack 2 may transmit electric signals to the electric units.

The technical elements explained in the present specification and drawings provide technical value and utility either independently or through various combinations. The present invention, moreover, is not limited to the combinations described in the claims at the time of filing. Also, the purpose of the technology illustrated in the present specification and drawings is to satisfy multiple objectives simultaneously. Herein, satisfying any one of those objectives gives technical value and utility to the present invention.

DESCRIPTION OF THE SYMBOLS IN THE DRAWINGS

2: Rack
4: Top panel
4*a*: Trough (Water collecting trough)
4*b*: Drain hole
6: Back panel
7: Terminal block
8*a*,8*b*: Side struts
9: Bottom panel
10: Central strut (vertical passage)
12: Electric connector
14: Fluid connector
16*a*: Tube for supplying cooling liquid
16*b*: Tube for discharging cooling liquid
22*a*: First opening through which cooling liquid is supplied
22*b*: Second opening through which cooling liquid is recovered
24: Seal member
50: Liquid-cooled electric unit
52: Flange

What is claimed is:

1. A rack for housing a liquid-cooled electric unit comprising:
    an electric connector for supplying electricity to the housed liquid-cooled electric unit;
    a fluid connector for supplying cooling liquid to the housed liquid-cooled electric unit,
    wherein the electric connector and the fluid connector are arranged in different positions in a horizontal cross-section of the rack;
    a vertical passage extending from a top panel of the rack to a bottom panel of the rack, wherein a tube for supplying the cooling liquid to the fluid connector is arranged in the vertical passage;
    a water collecting trough configured on the top panel; and
    a drain hole on the bottom of the trough that leads water from the trough into the vertical passage.

2. The rack as in claim 1, wherein a horizontal distance between a foreside of the rack and the electric connector is different from a horizontal distance between the foreside of the rack and the fluid connector.

3. The rack as in claim 1, wherein the electric connector is attached on a back panel of the rack, and the fluid connector is attached on the foreside of the rack.

4. The rack as in claim 1, further comprising a plate that spatially separates the electric connector from a tube for supplying the cooling liquid to the fluid connector.

5. The rack as in claim 1, wherein a seal member is arranged around openings of the fluid connector so that the seal member sticks to the liquid-cooled electric unit and seals a space around the openings of the fluid connector when the liquid-cooled electric unit is inserted and fixed to the rack.

6. The rack as in claim 1, wherein the rack is attached in a fuselage of an airplane.

\* \* \* \* \*